United States Patent
Bain

(10) Patent No.: US 8,255,440 B1
(45) Date of Patent: Aug. 28, 2012

(54) INCREASING LOGIC EFFICIENCY FOR EXCLUSIVE OR (XOR) EXPRESSIONS

(75) Inventor: Peter Bain, Ottawa (CA)

(73) Assignee: Altera Corporation, San Jose, CA (US)

( * ) Notice: Subject to any disclaimer, the term of this patent is extended or adjusted under 35 U.S.C. 154(b) by 1431 days.

(21) Appl. No.: 11/567,709

(22) Filed: Dec. 6, 2006

(51) Int. Cl.
*G06F 7/00* (2006.01)
*G06F 15/00* (2006.01)

(52) U.S. Cl. ........................................ 708/200
(58) Field of Classification Search .................. 708/200; 717/155
See application file for complete search history.

(56) References Cited

U.S. PATENT DOCUMENTS 7,111,273 B1 * 9/2006 Ganesan et al. .............. 716/17
2006/0230366 A1 * 10/2006 Baumgartner et al. .......... 716/3

OTHER PUBLICATIONS

Valeri Tomashau, Efficient 4-input LUTs FPGA Implementation of Combinatorial Multiplier over Canonical Base GF(16), 2002, p. 318-321.*
Turner et al., Multiplier-less Realization of a Poly-phase Filter Using LUT-based FPGAs, 2002, Springer-Verlag Berlin Heidelberg, p. 192-201.*
Turner et al., Highly Efficient Limited Range Multipliers for LUT-Based FPGA Architectures, IEEE Transactions on Very Large Scale Integration (VLSI) Systems, vol. 12, No. 10, Oct. 2004, p. 1113-1117.*
U.S. Appl. No. 11/403,342, filed Apr. 12, 2006.

* cited by examiner

*Primary Examiner* — Chat Do
*Assistant Examiner* — Kevin G Hughes
(74) *Attorney, Agent, or Firm* — Kwan & Olynick LLP

(57) ABSTRACT

Methods and apparatus are provided for more efficiently generating logic for implementing Exclusive OR (XOR) expressions. In one example, multiple centroids are generated and associated with main equations. Both the main equations and centroids are XOR expressions. In particular examples, main equations are associated with centroids that are closest in distance. Centroids can be modified to better match an associated subset of main equations. Centroids are generated and associated until the main equations are expressed as centroids and residue.

16 Claims, 7 Drawing Sheets

INCREASING LOGIC EFFICIENCY FOR EXCLUSIVE OR (XOR) EXPRESSIONS

DESCRIPTION OF RELATED ART

The present disclosure relates to Exclusive OR (XOR) expressions. In one example, the present invention relates to improving logic efficiency for XOR expressions.

A variety of applications including networking, graphics, and security applications require the use of XOR expressions. One particular example that uses large XOR expressions is the cyclic redundancy check (CRC). In one example, a message (M) is divided by a polynomial (P) known to both a sender and a receiver. The remainder (R) is transmitted with the message (M) to the receiver. The receiver uses the remainder (R) to verify that the message (M) has not been corrupted. R is referred to also as the Frame Check Sequence (FCS) or as a CRC. Although it is possible that different messages can give the same remainder R when divided by a polynomial (P), CRC computations have been highly effective, as the probability that corrupted data can pass a 32-bit CRC (CRC32) check is remote.

Galois field division is often used to determine R. Galois field division is implemented using shift registers and XOR gates on a programmable chip. In a simplified example, division can be performed by performing one XOR, bit shifting, performing another XOR, bit shifting, etc. However, to perform a CRC of 8 data bits, 8 clocks cycles would be required. To increase efficiency, it is well recognized that the bits in R or in a CRC can be calculated by performing XOR computations of various data and polynomial bits simultaneously.

However, performing these computations can be inefficient on programmable chips. That is, performing these computations may require many levels of logic or require a large amount of logic. Consequently, the techniques of the present invention provide efficient mechanisms for performing XOR operations on programmable chips.

OVERVIEW OF THE INVENTION

Methods and apparatus are provided for more efficiently generating logic for implementing Exclusive OR (XOR) expressions. In one example, multiple centroids are generated and associated with main equations. Both the main equations and centroids are XOR expressions. In particular examples, main equations are associated with centroids that are closest in distance. Centroids can be modified to better match an associated subset of main equations. Centroids are generated and associated until the main equations are expressed as centroids and residue.

In one particular embodiment, a technique is provided. A size of a programmable chip lookup table (LUT) is identified. Multiple main equations are identified. The multiple main equations are Exclusive OR (XOR) expressions. Multiple centroids including a first centroid are generated. The first centroid has a weight corresponding to the size of the programmable chip lookup table (LUT). The first centroid is associated with a first subset of the main equations by considering the distance between the first centroid and members of the first subset of main equations.

In another particular embodiment, an apparatus including memory, a processor, and an output interface is provided. The processor is connected to memory and configured to identify multiple main equations. The multiple main equations are Exclusive OR (XOR) expression. The processor generates multiple centroids including a first centroid. The first centroid has a weight corresponding to the size of a logic block. The first centroid is associated with a first subset of main equations by considering the distance between the first centroid and members of the first subset of the plurality of main equations;

These and other features and advantages of the present invention will be presented in more detail in the following specification of the invention and the accompanying figures, which illustrate by way of example the principles of the invention.

BRIEF DESCRIPTION OF THE DRAWINGS

The invention may best be understood by reference to the following description taken in conjunction with the accompanying drawings, which illustrate particular embodiments of the present invention.

DESCRIPTION OF PARTICULAR EMBODIMENTS

Figure 1:
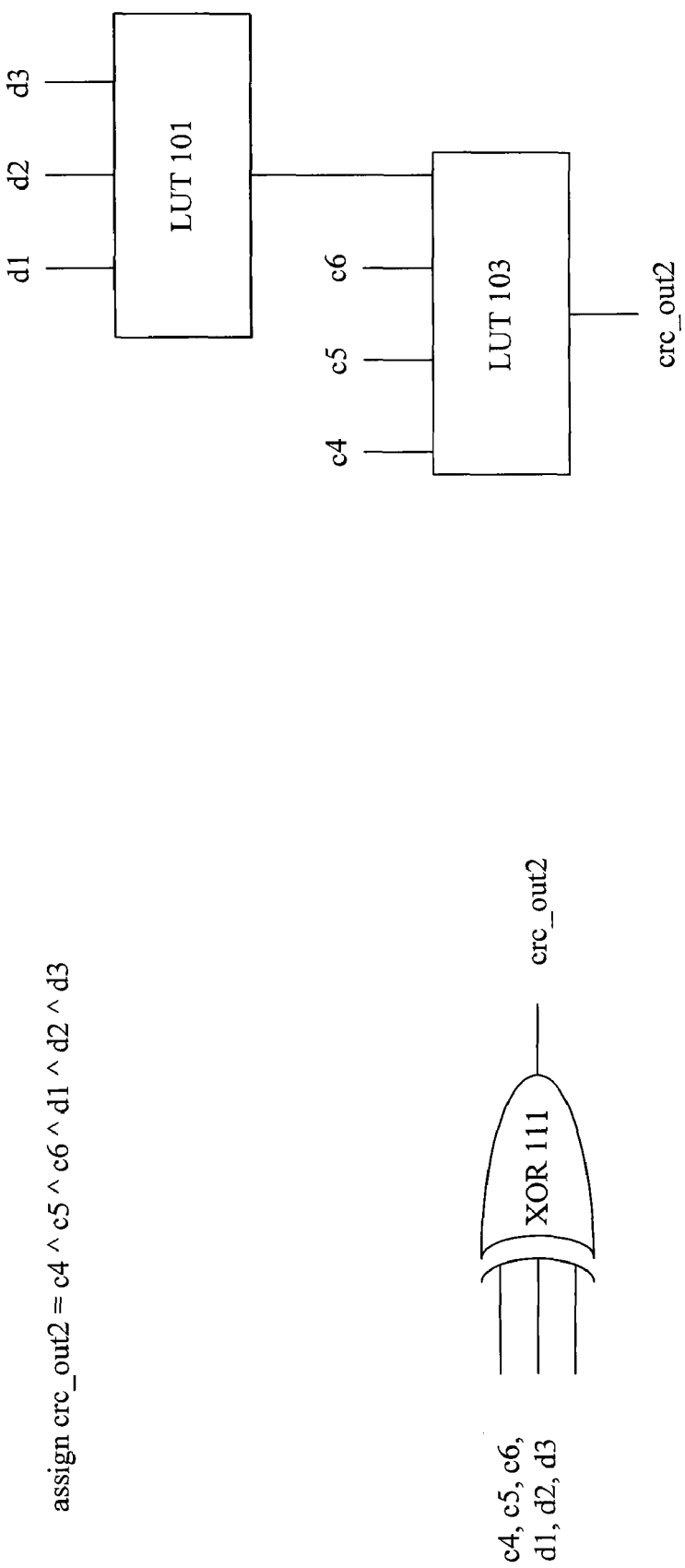
FIG. 1 is a diagrammatic representation showing an Exclusive OR (XOR) gate implemented using lookup tables (LUTs).

Reference will now be made in detail to some specific examples of the invention including the best modes contemplated by the inventors for carrying out the invention. Examples of these specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims.

For example, the techniques of the present invention will be described in the context of particular applications and devices. However, it should be noted that the techniques of the present invention can be applied to a variety of different applications and a variety of different devices. In the following description, numerous specific details are set forth in order to provide a thorough understanding of the present invention. The present invention may be practiced without some or all of these specific details. In other instances, well known process operations have not been described in detail in order not to unnecessarily obscure the present invention.

Various techniques and mechanisms of the present invention will sometimes be described in singular form for clarity. However, it should be noted that some embodiments include multiple iterations of a technique or multiple instantiations of a mechanism unless noted otherwise. For example, a processor is used in a variety of contexts. However, it will be appreciated that multiple processors can also be used while remaining within the scope of the present invention unless otherwise noted. Furthermore, the techniques and mechanisms of the present invention will sometimes describe two entities as being connected. It should be noted that a connection between two entities does not necessarily mean a direct, unimpeded connection, as a variety of other entities may reside between the two entities. For example, a processor may be connected to memory, but it will be appreciated that a variety of bridges and controllers may reside between the processor and memory. Consequently, a connection does not necessarily mean a direct, unimpeded connection unless otherwise noted.

A variety of applications such as networking, graphics, and security applications use large Exclusive OR (XOR) expressions. One application that uses a large number of wide XOR expressions are cyclic redundancy checks (CRCs), used in many networking and data storage applications to detect transmission errors and data corruption. In a simplified implementation, a data stream or message (M) is divided by a polynomial (P) known to both a sender and a receiver. The remainder (R) is stored and/or transmitted with the message to allow later verification that M was not corrupted. R is also referred to as a Frame Check Sequence (FCS) or a CRC. To allow efficient division of M by R, Galois field division is used.

Parallel implementations of order-2 Galois field arithmetic, such as is used in Cyclic Redundancy Check error control coding, involve multiple XOR equations. These equations use different subsets of the same input bits. It is desirable to efficiently calculate subexpressions of these input bits such that the main equations can be expressed in terms of the subexpressions. This helps to minimize logic and also allows pipelining of the calculation of the main equations.

Galois field division is implemented using shift registers and Exclusive OR (XOR) gates in a variety of hardware devices. Division can be performed by performing an XOR, bit shifting, performing another XOR, bit shifting, etc. To increase efficiency, it is well recognized that the bits in R or in a CRC can be calculated by performing XOR computations of various data and polynomial bits simultaneously.

In one example, a divisor is three bits (e.g. 101) and a dividend is six bits (e.g. 111001). In simplified polynomial long division, it is determined at each stage of division whether the leading bit of the current three bits is 0 or 1. If it is 0, a 0 is placed in the quotient and an XOR operation is performed with the current bits and 000. If the leading bit of the current three bits is 1, a 1 is placed in the quotient and an XOR is performed with the current bits and the divisor. It is well recognized that computing remainders is even simpler because the quotient is not needed. In a simplified example, a sequence of six bit XORs can be performed with bit shifting after each XOR.

It is well known that output bits can be determined by performing XOR operations on various polynomial and data bits.

The techniques of the present invention contemplate generating centroids for a set of large XOR main expressions or main equations, where the centroids share a common set of input bits. According to various embodiments, the centroids are XOR subexpressions that are generated randomly. Each centroid is associated with a subset of the nearest main equations. Any subexpression that is generated and assigned as a center or near center for a subset of main equations is referred to herein as a centroid. Each centroid is adjusted until it is nearest the center of the cluster of main equations. The process is repeated with additional centroids being generated and associated with subsets of main equations until main equations are expressed entirely using centroids and a few remaining terms or residue.

The techniques of the present invention recognize that XOR equations can be expressed using subexpressions with redundant terms, provided that a redundant term appears an even number of times over the subexpressions. It can therefore cover main equations with a smaller set of subexpressions than can conventional minimizers.

In one particular example, a clustering algorithm is used determine the subexpressions from which the main equations are calculated. The techniques of the present invention recognize that the XOR operation allows redundant terms in the subexpressions. For example, $$q = d0 \wedge d1 \wedge d3 \wedge d4;$$

can be expressed with subexpressions $$c0 = d0 \wedge d1 \wedge d2; \text{ and}$$

$$c1 = d2 \wedge d3 \wedge d4;$$

q can also be expressed as $c0 \wedge c1$, since $$(d0 \wedge d1 \wedge d2) \wedge (d2 \wedge d3 \wedge d4) = d0 \wedge d1 \wedge d3 \wedge d4$$

i.e. the d2 terms cancel since d2 occurs an even number of times.

FIG. 1 is a diagrammatic representation showing CRC decomposition or factoring for implementation on programmable chips. Programmable chips use different types of resources that can be allocated to implement a programmable chip. In one example, the programmable chip uses logic elements for implementing each of the various components on the programmable chip. Some programmable chips also include preconfigured logic blocks as resources that can be allocated in different manners to run various subroutines.

Logic elements typically can be implemented using components such as antifuses, static RAM, and EPROMS. Any mechanism on a programmable chip that performs an operation on a given number of input lines to provide one or more outputs based on information programmed is herein referred to as a logic element. Some logic elements are implemented as combinations of look up tables and switches for performing Boolean operations on input lines. In one example, a logic element includes a 16-bit SRAM lookup table (LUT) that can implement an arbitrary 4-input logic function, circuitry that forms a fast carry chain and a fast cascade chain, a register and preset/reset logic for the register. In other examples, a logic element allows implementation of other fixed sized input logic functions.

Because programmable chips implement logic using LUTs with limited width, wide XORs such as $c4 \wedge c5 \wedge c6 \wedge d1 \wedge d2 \wedge d3$ need to be decomposed or factored in order to fit in a single LUT. An XOR function 111 is implemented using multiple LUTs 101 and 103. According to various embodiments, three input LUT 101 takes inputs d1, d2, d3 and provides an output to LUT 103. Four input LUT 103 takes inputs c4, c5, c6, and the output of LUT 101 and provides crc_out2. Large XORs often do not fit in a single LUT. For example, 32 bit data uses XORs with up to 34 inputs. A 128 bit data sequence uses an 89 input XOR.

Figure 2:
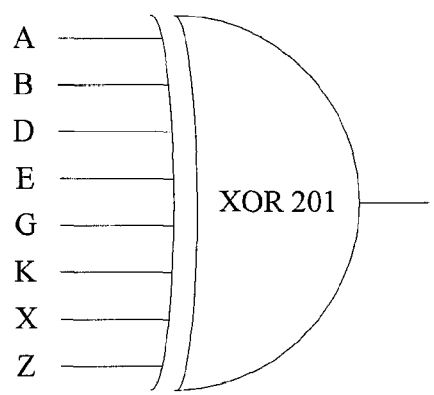
FIG. 2 is a diagrammatic representation showing main equations.
Figure 2:
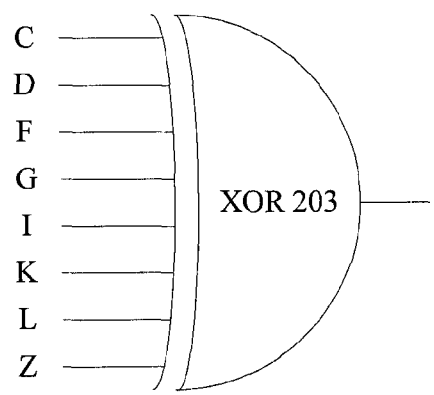
Figure 2:
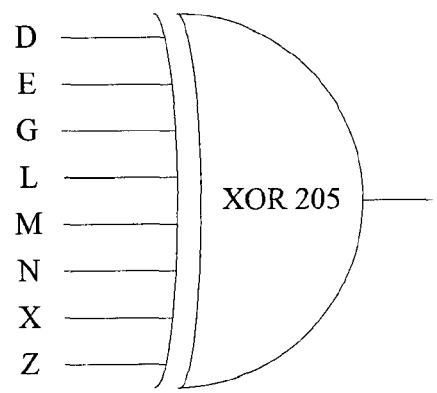
Figure 2:
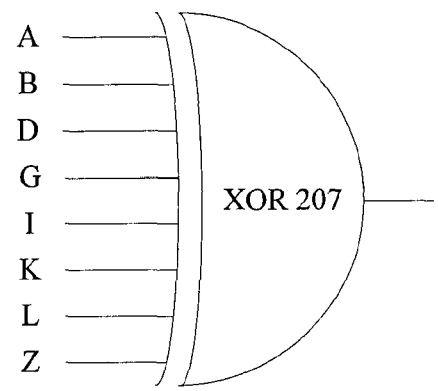

FIG. 2 is a diagrammatic representation showing main equations implemented using XOR gates. Main equation $A \wedge B \wedge D \wedge E \wedge G \wedge K \wedge X \wedge Z$ is implemented using XOR gate 201. Main equation $C \wedge D \wedge F \wedge G \wedge I \wedge K \wedge L \wedge Z$ is implemented using XOR gate 203. Main equation $D \wedge E \wedge G \wedge L \wedge M \wedge N \wedge X \wedge Z$ is implemented using XOR gate 205. Main equation $A \wedge B \wedge D \wedge G \wedge I \wedge K \wedge L \wedge Z$ is implemented using XOR gate 207. Implementing a large XOR gate with 8 inputs often require multiple lookup tables and/or multiple levels of lookup tables. For example, three lookup tables may be required to implement each main equation, resulting in a total requirement of 12 lookup tables. It is recognized that logic can be implemented more efficiently to reduce the number of lookup tables and the number of layers required.

Figure 3:
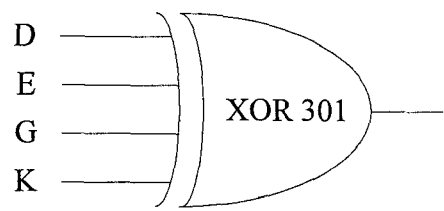
FIG. 3 is a diagrammatic representations showing centroids.
Figure 3:
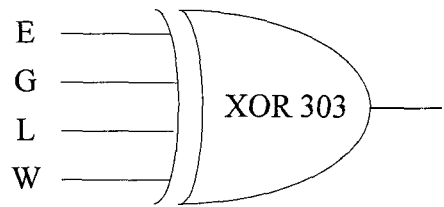

FIG. 3 is diagrammatic representation showing generated centroids. According to various embodiments, centroids are randomly generated and associated with various main equations. Randomly generated centroid 301 has inputs D, E, G, and K. Randomly generated centroid 303 has inputs E, G, L, W. According to various embodiments, main equations are associated with the nearest randomly generated centroids. In particular embodiments, the distance between a main equation and a centroid is the number of bit positions in which the main equation's vector and the centroid's vector differ. In one example, a main equation is matched with a centroid having the most common bit positions. If there is more than one candidate centroid (i.e. there is a tie), a centroid can be selected randomly or a main equation can be associated with the most popular centroid, or the main equation can be associated with the least popular centroids. A variety of tie-breaking criteria can be used.

In one example, centroids in a set of generated centroids each have four bit positions. For example, centroid 301 has inputs D, E, G, and K and centroids 303 has inputs E, G, L, and W. Each of the main equations is associated with either centroids 301 or centroids 303. The results of the centroids can also be fed into flip flops to allow pipelining.

Figure 4:
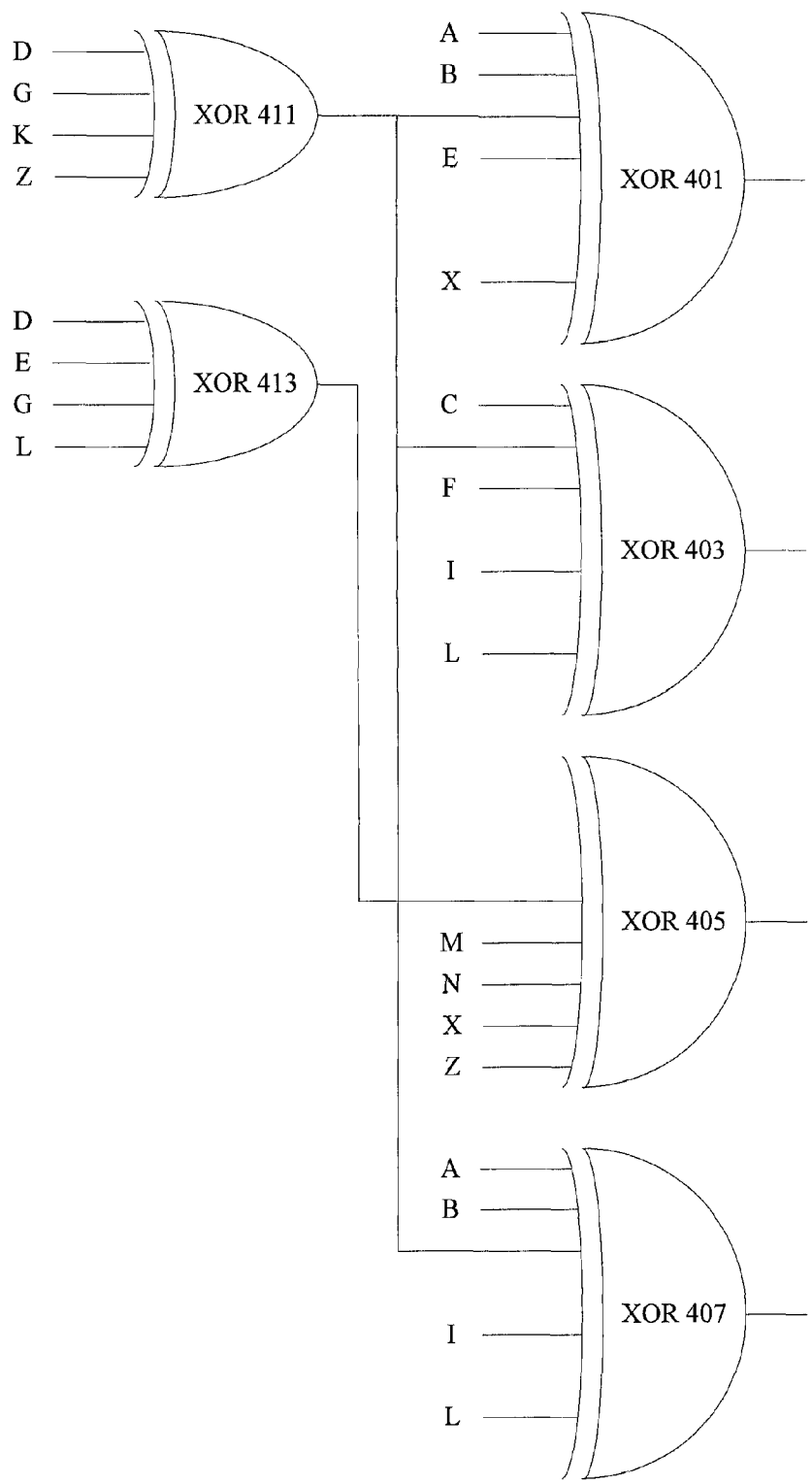
FIG. 4 is a diagrammatic representation showing association of centroids with main equations.

FIG. 4 is a diagrammatic representation showing main equations associated with centroids. Main equation 401 has inputs A, B, D, E, G, K, X, and Z. Main equation 403 has inputs C, D, F, G, I, K, L, and Z. Main equation 405 has inputs D, E, G, L, M, N, X, and Z. Main equation 407 has inputs A, B, D, G, I, K, L, and Z. According to various embodiments, main equation 401 is compared to both centroid 301 and 303. Centroid 301 includes inputs D, E, G, and K and centroid 303 includes inputs E, G, L, and W. It is determined that main equation 401 is closer to centroid 301, since main equation 401 and centroid 301 both have inputs D, E, G, and K. On the other hand, main equation 401 only shares inputs E and G with centroid 303. Consequently, main equation 401 is associated with centroid 301.

According to various embodiments, main equation 403 is compared to both centroid 301, where centroid 301 includes inputs D, E, G, and K and centroid 303 includes inputs E, G, L, and W. It is determined that main equation 403 is closer to centroid 301, since main equation 403 and centroid 301 both have inputs D, G, and K. On the other hand, main equation 403 only shares inputs G and L with centroid 303. Consequently, main equation 403 is associated with centroid 301.

According to various embodiments, main equation 405 is compared to both centroid 301 and centroid 303. It is determined that main equation 405 is closer to centroid 303, since main equation 405 and centroid 303 both have inputs E, G, and L. On the other hand, main equation 405 only shares inputs E and G with centroid 303. Consequently, main equation 405 is associated with centroid 303.

According to various embodiments, main equation 407 is compared to both centroid 301 and centroid 303. It is determined that main equation 407 is closer to centroid 301, since main equation 407 and centroid 301 both have inputs D, G, and K. On the other hand, main equation 407 only shares inputs G and L with centroid 303. Consequently, main equation 407 is associated with centroid 301.

In particular examples, after each of the main equations is associated with a centroid, each centroid is updated so that it is closer to the center of each associated subset of main equations. For example, centroid 301 is updated into centroid 411 so that it resides closer to the middle of main equations 401, 403, and 407. In this particular instance, it is determined that the inputs D, G, K, and Z are the most popular inputs for main equations 401, 403, and 407. In fact, all of the main equations in the subset of main equations associated with centroid 301 have D, G, K, and Z. Consequently, centroid 301 with inputs D, E, G, and K is modified into centroid 411, with inputs D, G, K, and Z. In particular examples, the most popular inputs for a subset of main equations are selected as the updated values for an associated centroid.

Main equation 405 associated with centroid 303 provides updated inputs to generated updated centroid 413. Updated centroid 413 has inputs D, E, G, and L. According to various embodiments, another set of centroids are then generated and associated with main equations 401, 403, 405, and 407. In particular examples, the new set of centroids are then again updated based upon criteria such as the popularity of inputs in a particular subset of main equations. According to various embodiments, centroids are generated until all main equations are expressed as centroids and as residue or a few remaining inputs.

According to various embodiments, centroid size is based at least partially upon the size of lookup tables. That is, it is recognized that it is efficient to be able to implement an XOR gate using a single lookup table. Consequently, a lookup table size of six may provide centroids with four inputs. In some examples, a lookup table size of eleven may provide centroids with eight inputs.

Figure 5:
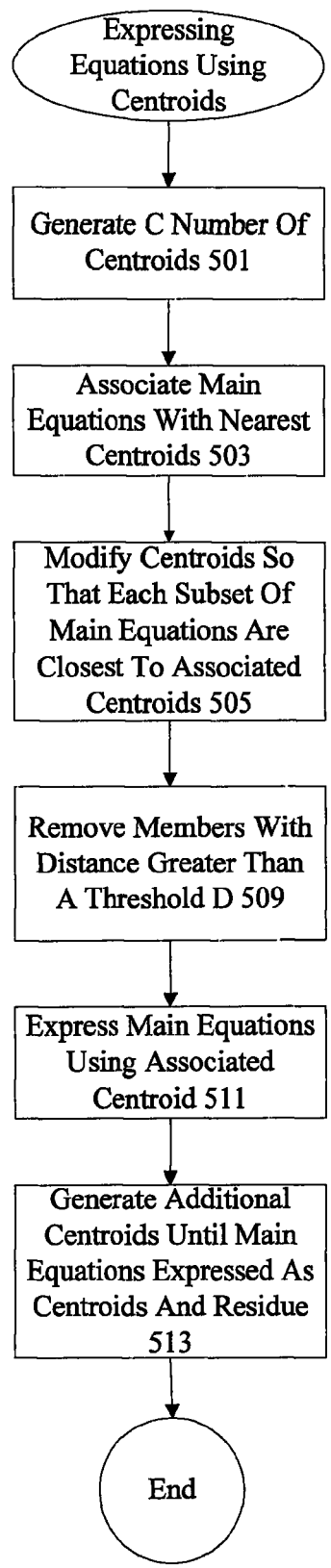
FIG. 5 is a flow process diagram showing a technique for efficiently generating logic for XOR expressions.

FIG. 5 is a flow process diagram showing one technique for expressing XOR equations using centroids. At 501, C number of centroids are generated. In some examples, C is a fraction of the number of main equations. In a particular example, C is one fourth of the number of main equations. C can also be based on the number of main equations and the number of inputs. At 503, main equations are associated with the nearest centroids. According to various embodiments, each main equation is matched with a centroid having the largest number of shared inputs. At 505, each centroid can be modified to be closer to the center of the associated main equations. In some examples, centroids are modified to include the most popular input in an associated subset of main equations. For example, if the most popular inputs of an associated subset of main equations are D, G, L, and Y, the centroid is modified to include D, G, L, and Y. According to various embodiments, the centroid size is limited to the size of an XOR expression that can fit in a single lookup table. According to various embodiments, an adjusted centroid has the shortest mean distance to all of the main equations in the subset of main equations.

At 509, main equations in a subset of main equations that have a distance to an adjusted centroid greater than a threshold D are removed from the subset. For example, if a main equation only shares two inputs with an adjusted centroid, the main equation is not included in the subset and consequently not associated with the adjusted centroid.

At 511, main equations are expressed using associated centroids. At 513, additional centroids are generated and associated with main equations until all main equations are expressed as centroids and residue.

Figure 6:
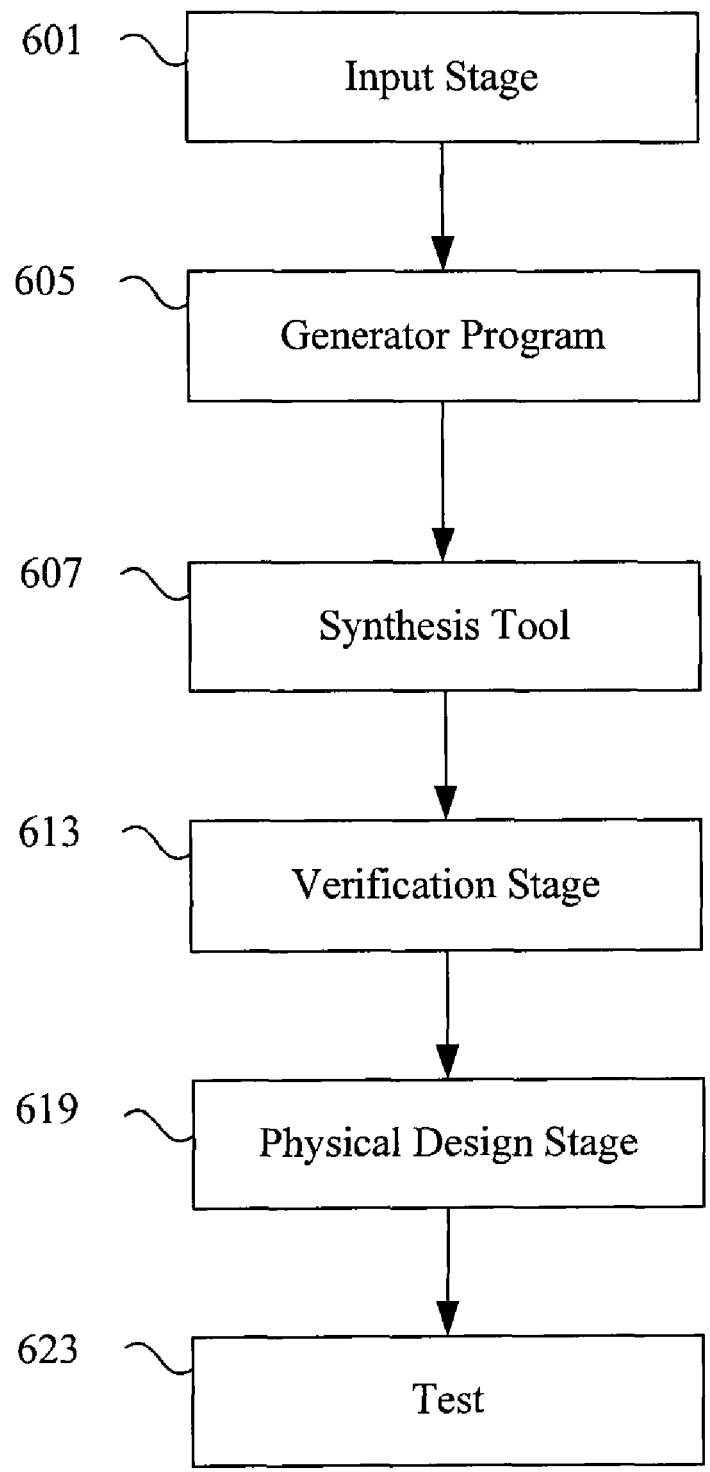
FIG. 6 is a diagrammatic representation showing a technique for implementing the programmable chip.

FIG. 6 is a diagrammatic representation showing implementation of a programmable chip. According to various embodiments, an input stage 601 receives selection information typically from a user for logic to be implemented on an electronic device. A generator program 605 creates a logic description and provides the logic description along with other customized logic to any of a variety of synthesis tools, place and route programs, and logic configuration tools to allow a logic description to be implemented on an electronic device.

The input stage 601 may be a graphical user interface using wizards for allowing efficient or convenient entry of information. The input stage may also be a text interface or a program reading a data file such as a spreadsheet, database table, or schematic to acquire selection information. The input stage 601 produces an output containing information about the various modules selected.

In typical implementations, the generator program 605 can identify the selections and generate a logic description with information for implementing the various modules. The generator program 605 can be a Perl script creating HDL files such as Verilog, Abel, VHDL, and AHDL files from the module information entered by a user. In one example, the generator program identifies a portion of a high-level language program to accelerate. The other code is left for execution on a processor core. According to various embodiments, the generator program 605 identifies pointers and provides ports for each pointer. The generator program 605 also provides information to a synthesis tool 607 to allow HDL files to be automatically synthesized. In some examples, a logic description is provided directly by a designer. Hookups between various components selected by a user are also interconnected by a generator program. Some of the available synthesis tools are Leonardo Spectrum, available from Mentor Graphics Corporation of Wilsonville, Oregon and Synplify available from Synplicity Corporation of Sunnyvale, Calif. The HDL files may contain technology specific code readable only by a synthesis tool. The HDL files at this point may also be passed to a simulation tool 609.

As will be appreciated by one of skill in the art, the input stage 601, generator program 605, and synthesis tool 607 can be separate programs. The interface between the separate programs can be a database file, a log, or simply messages transmitted between the programs. For example, instead of writing a file to storage, the input stage 601 can send messages directly to the generator program 605 to allow the generator program to create a logic description. Similarly, the generator program can provide information directly to the synthesis tool instead of writing HDL files. Similarly, input stage 601, generator program 605, and synthesis tool 607 can be integrated into a single program.

A user may select various modules and an integrated program can then take the user selections and output a logic description in the form of a synthesized netlist without intermediate files. Any mechanism for depicting the logic to be implemented on an electronic device is referred to herein as a logic description. According to various embodiments, a logic description is an HDL file such as a VHDL, Abel, AHDL, or Verilog file. A logic description may be in various stages of processing between the user selection of components and parameters to the final configuration of the device. According to other embodiments, a logic description is a synthesized netlist such as an Electronic Design Interchange Format Input File (EDIF file). An EDIF file is one example of a synthesized netlist file that can be output by the synthesis tool 607.

A synthesis tool 607 can take HDL files and output EDF files. Tools for synthesis allow the implementation of the logic design on an electronic device. Some of the available synthesis tools are Leonardo Spectrum, available from Mentor Graphics Corporation of Wilsonville, Oregon and Synplify available from Synplicity Corporation of Sunnyvale, Calif. Various synthesized netlist formats will be appreciated by one of skill in the art.

A verification stage 613 typically follows the synthesis stage 607. The verification stage checks the accuracy of the design to ensure that an intermediate or final design realizes the expected requirements. A verification stage typically includes simulation tools and timing analysis tools. Tools for simulation allow the application of inputs and the observation of outputs without having to implement a physical device. Simulation tools provide designers with cost effective and efficient mechanisms for both functional and timing verification of a design. Functional verification involves the circuit's logical operation independent of timing considerations. Parameters such as gate delays are disregarded.

Timing verification involves the analysis of the design's operation with timing delays. Setup, hold, and other timing requirements for sequential devices such as flip-flops are confirmed. Some available simulation tools include Synopsys VCS, VSS, and Scirocco, available from Synopsys Corporation of Sunnyvale, Calif. and Cadence NC-Verilog and NC-VHDL available from Cadence Design Systems of San Jose, Calif. After the verification stage 613, the synthesized netlist file can be provided to physical design tools 619 including place and route and configuration tools. A place and route tool typically locates logic cells on specific logic elements of a target hardware device and connects wires between the inputs and outputs of the various logic elements in accordance with logic required to implement an electronic design. The device can also be physically tested at 623.

For programmable logic devices, a programmable logic configuration stage can take the output of the place and route tool to program the logic device with the user selected and parameterized modules. According to various embodiments, the place and route tool and the logic configuration stage are provided in the Quartus Development Tool, available from Altera Corporation of San Jose, Calif. As will be appreciated by one of skill in the art, a variety of synthesis, place and route, and programmable logic configuration tools can be tested using various techniques of the present invention.

As noted above, different stages and programs can be integrated in a variety of manners. According to one embodiment, the input stage 601, the generator program 605, the synthesis tool 607, the verification tools 613, and physical design tools 619 are integrated into a single program. The various stages are automatically run and transparent to a user. The program can receive the user selected modules, generate a logic description depicting logic for implementing the various selected modules, and implement the electronic device. As will be appreciated by one of skill in the art, HDL files and EDIF files are mere examples of a logic description. Other file formats as well as internal program representations are other examples of a logic description.

Figure 7:
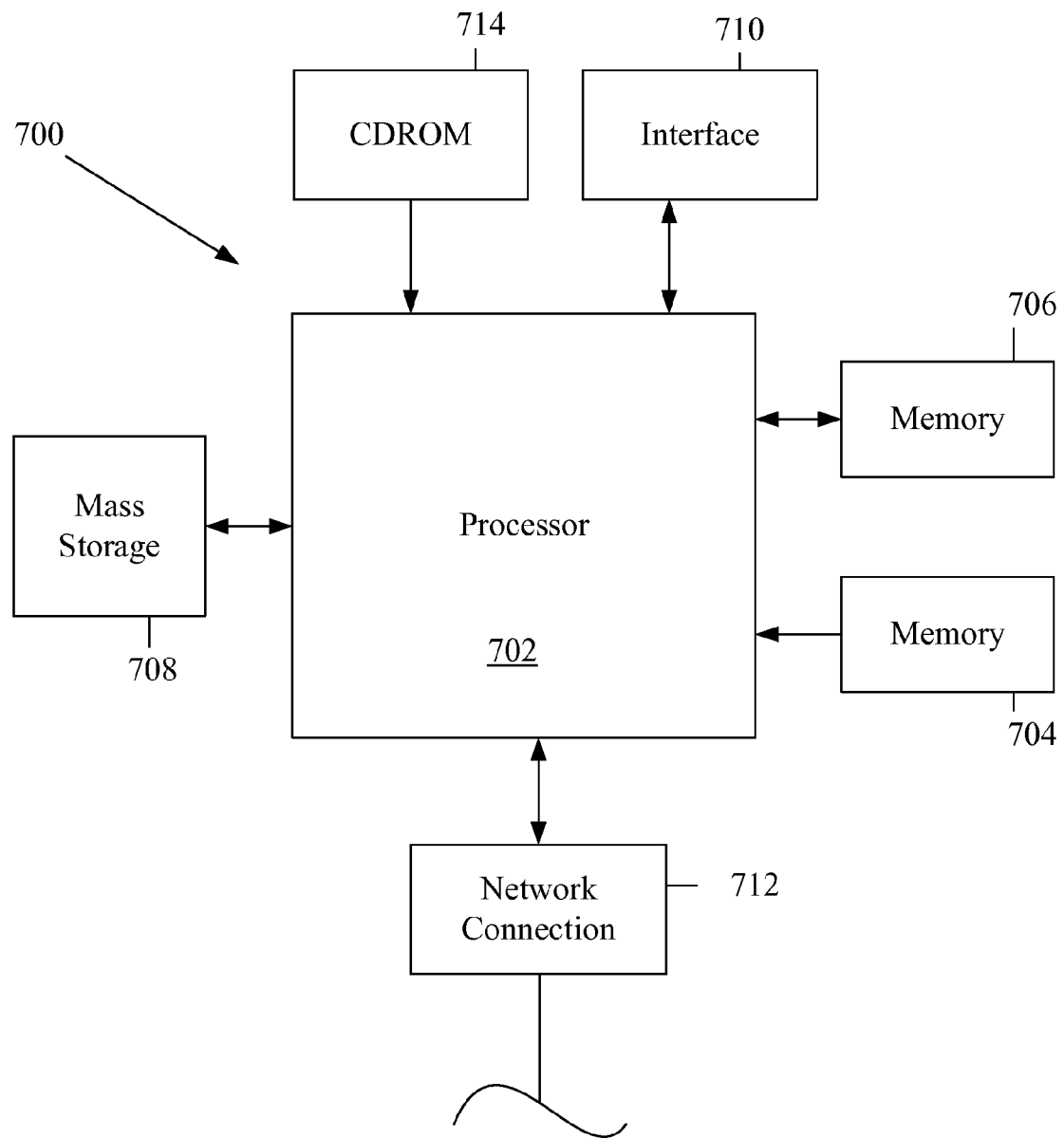
FIG. 7 is a diagrammatic representation depicting a computer system.

FIG. 7 illustrates a typical computer system that can be used to implement a programmable chip having shared I/O lines. The computer system 700 includes any number of processors 702 (also referred to as central processing units, or CPUs) that are coupled to devices including memory 706 (typically a random access memory, or "RAM"), memory 704 (typically a read only memory, or "ROM"). The processors 702 can be configured to generate a test sequences for any designated processor. As is well known in the art, memory 704 acts to transfer data and instructions uni-directionally to the CPU and memory 706 is used typically to transfer data and instructions in a bi-directional manner.

Both of these memory devices may include any suitable type of the computer-readable media described above. A mass storage device 708 is also coupled bi-directionally to CPU 702 and provides additional data storage capacity and may include any of the computer-readable media described above.

The mass storage device 708 may be used to store programs, data and the like and is typically a secondary storage medium such as a hard disk that is slower than memory. The mass storage device 708 can be used to hold a library or database of prepackaged logic or intellectual property functions, as well as information on generating particular configurations. It will be appreciated that the information retained within the mass storage device 708, may, in appropriate cases, be incorporated in standard fashion as part of memory 706 as virtual memory. A specific mass storage device such as a CD-ROM 714 may also pass data uni-directionally to the CPU.

CPU 702 is also coupled to an interface 710 that includes one or more input/output devices such as such as video monitors, track balls, mice, keyboards, microphones, touch-sensitive displays, transducer card readers, magnetic or paper tape readers, tablets, styluses, voice or handwriting recognizers, or other well-known input devices such as, of course, other computers. Finally, CPU 702 optionally may be coupled to a computer or telecommunications network using a network connection as shown generally at 712. With such a network connection, it is contemplated that the CPU might receive information from the network, or might output information to the network in the course of performing the above-described method steps. It should be noted that the system 700 may also be associated with devices for transferring completed designs onto a programmable chip. The above-described devices and materials will be familiar to those of skill in the computer hardware and software arts.

The hardware elements described above may be configured (usually temporarily) to act as multiple software modules for performing the operations of this invention. For example, instructions for running a generator program, input stage (e.g., a wizard), and/or compiler may be stored on mass storage device 708 or 714 and executed on CPU 708 in conjunction with primary memory 706.

Although many of the components and processes are described above in the singular for convenience, it will be appreciated by one of skill in the art that multiple components and repeated processes can also be used to practice the techniques of the present invention.

While the invention has been particularly shown and described with reference to specific embodiments thereof, it will be understood by those skilled in the art that changes in the form and details of the disclosed embodiments may be made without departing from the spirit or scope of the invention. For example, embodiments of the present invention may be employed with a variety of primary and secondary components and should not be restricted to the ones mentioned above. It is therefore intended that the invention be interpreted to include all variations and equivalents that fall within the true spirit and scope of the present invention.

What is claimed is:

1. A method comprising:
    identifying a size of a programmable chip lookup table (LUT);
    identifying a plurality of main equations, wherein the plurality of main equations are Exclusive OR (XOR) expressions;
    generating, by using a processor configured to generate centroids, a plurality of centroids including a first centroid, wherein the plurality of centroids are randomly generated, wherein the first centroid has a weight corresponding to the size of the programmable chip lookup table (LUT) maintained in memory coupled to the processor;
    associating, by using the processor, the first centroid with a first subset of the plurality of main equations based on a distance between the first centroid and each equation of the first subset of the plurality of main equations, wherein the distance is a difference between number of bit positions in a vector associated with said each equation of the first subset of the plurality of main equations and number of bit positions in a vector associated with the first centroid, wherein a main equation is associated with one of the plurality of centroids having the most common bit positions; and
    modifying the first centroid to form a modified first centroid, wherein the modified first centroid has a higher number of common bit positions with the first subset of the plurality of main equations than the first centroid.

2. The method of claim 1, wherein the associating comprises determining equations within the first subset that are closest in distance to the first centroid.

3. The method of claim 2, wherein the determining comprises identifying equations within the first subset matching the first centroid.

4. The method of claim 3 further comprising substituting the equations within the first subset that match the first centroid with the first centroid.

5. The method of claim 3 further comprising removing members of the first subset of the plurality of main equations having a distance to the first centroid greater than a predetermined value.

6. The method of claim 5 further comprising substituting the equations within the first subset that match the first centroid with the modified first centroid.

7. The method of claim 3, wherein the modified first centroid is implemented using a single lookup table LUT.

8. The method of claim 1 further comprising generating a second centroid, wherein the second centroid has a weight corresponding to the size of the programmable chip lookup table (LUT).

9. The method of claim 1 further comprising associating a second centroid with a second subset of the plurality of main equations.

10. An apparatus comprising:
    memory;
    a processor coupled to memory, the processor configured to identify a plurality of main equations including Exclusive OR (XOR) expressions, generate a plurality of centroids including a first centroid, wherein the plurality of centroids are randomly generated and has a weight corresponding to the size of a logic block, and associate the first centroid with a first subset of the plurality of main equations by considering the distance between the first centroid and members of the first subset of the plurality of main equations, wherein the distance is a difference between number of bit positions in a vector associated with each equation of the subset of the plurality of main equations and number of bit positions in a vector associated with the first centroid, wherein a main equation is associated with one of the plurality of centroids having the most common bit positions; and
    an output interface operable to implement logic using the plurality of main equations on logic circuitry of a device;
    wherein the first centroid is modified to form a modified first centroid, wherein the modified first centroid has a higher number of common bit positions with the first subset of the plurality of main equations than the first centroid.

11. The apparatus of claim 10, wherein the first centroid is associated with the first subset of the plurality of main equations by determining the plurality of main equations within the subset that are closest in distance to the first centroid.

12. The apparatus of claim 11, wherein distance is determined by finding equations within the subset that correspond to the first centroid.

13. The apparatus of claim 12, wherein the equations within the subset that match the first centroid are substituted with the first centroid.

14. The apparatus of claim 10, wherein the modified first centroid is implemented using a single lookup table (LUT).

15. The apparatus of claim 10, wherein the modified first centroid is implemented using cell logic.

16. The apparatus of claim 10, wherein the modified first centroid is implemented using discrete logic.

* * * * *